(12) United States Patent
Mukhopadhyay et al.

(10) Patent No.: US 12,326,336 B2
(45) Date of Patent: Jun. 10, 2025

(54) READOUT CIRCUIT FOR A MEMS SENSOR UNIT

(71) Applicant: Robert Bosch GmbH, Stuttgart (DE)

(72) Inventors: Ishita Mukhopadhyay, Munich (DE); Andrea Visconti, Munich (DE); Francesco Diazzi, Munich (DE)

(73) Assignee: ROBERT BOSCH GMBH, Stuttgart (DE)

( * ) Notice: Subject to any disclaimer, the term of this patent is extended or adjusted under 35 U.S.C. 154(b) by 321 days.

(21) Appl. No.: 18/006,500

(22) PCT Filed: Jul. 2, 2021

(86) PCT No.: PCT/EP2021/068347
§ 371 (c)(1),
(2) Date: Jan. 23, 2023

(87) PCT Pub. No.: WO2022/033767
PCT Pub. Date: Feb. 17, 2022

(65) Prior Publication Data
US 2023/0288205 A1    Sep. 14, 2023

(30) Foreign Application Priority Data
Aug. 13, 2020  (DE) .................. 10 2020 210 270.8

(51) Int. Cl.
*G01C 19/5776*    (2012.01)
(52) U.S. Cl.
CPC ................ *G01C 19/5776* (2013.01)
(58) Field of Classification Search
CPC ........... G01C 19/5776; H03F 2200/411; H03F 2200/516
See application file for complete search history.

(56) References Cited

U.S. PATENT DOCUMENTS

| 7,259,632 B1* | 8/2007 | LeBoeuf, II | .......... H03F 1/0222 |
| | | | 330/311 |
| 7,545,217 B1* | 6/2009 | Reyes | .................. H03G 3/3047 |
| | | | 330/285 |

(Continued)

FOREIGN PATENT DOCUMENTS

| DE | 19734530 A1 | 2/1998 |
| DE | 102014106428 A1 | 11/2014 |

(Continued)

OTHER PUBLICATIONS

International Search Report for PCT/EP2021/068347, Issued Sep. 30, 2021.

*Primary Examiner* — David J Bolduc
(74) *Attorney, Agent, or Firm* — NORTON ROSE FULBRIGHT US LLP

(57) ABSTRACT

A readout circuit for a MEMS sensor unit. The readout circuit includes at least one circuit component which includes a cascade circuit including at least one input amplifier and at least one output amplifier. A predefined external supply voltage is available for operating the readout circuit. In the process, the input amplifier is operated with a first supply voltage which is, by comparison, less than or equal to the external supply voltage, and the output amplifier is operated with a second supply voltage which is, by comparison, greater than the external supply voltage. At least one circuit means, which makes the second supply voltage is also provided, which is, by comparison, greater than the external supply voltage, available to the output amplifier.

8 Claims, 1 Drawing Sheet

(56) References Cited

U.S. PATENT DOCUMENTS

| | | | | |
|---|---|---|---|---|
| 8,717,083 B2* | 5/2014 | Lin | ............... | H03F 3/45183 |
| | | | | 327/54 |
| 2002/0067210 A1* | 6/2002 | Donig | ............... | H03F 3/4556 |
| | | | | 330/298 |
| 2008/0174372 A1* | 7/2008 | Tucker | ............... | H03F 3/187 |
| | | | | 330/297 |
| 2009/0251001 A1* | 10/2009 | Kojima | ............... | H03F 1/0211 |
| | | | | 307/18 |
| 2013/0027130 A1* | 1/2013 | Ubbesen | ............... | H03G 3/004 |
| | | | | 330/127 |
| 2015/0070098 A1 | 3/2015 | Ngo et al. | | |
| 2015/0276407 A1 | 10/2015 | Bhandari | | |
| 2016/0241200 A1* | 8/2016 | Nadimpalli | ............... | G05F 1/561 |
| 2018/0219516 A1* | 8/2018 | Soliman | ............... | H03L 7/24 |

FOREIGN PATENT DOCUMENTS

| | | |
|---|---|---|
| DE | 102017205984 A1 | 10/2018 |
| EP | 3237844 B1 | 8/2020 |

\* cited by examiner

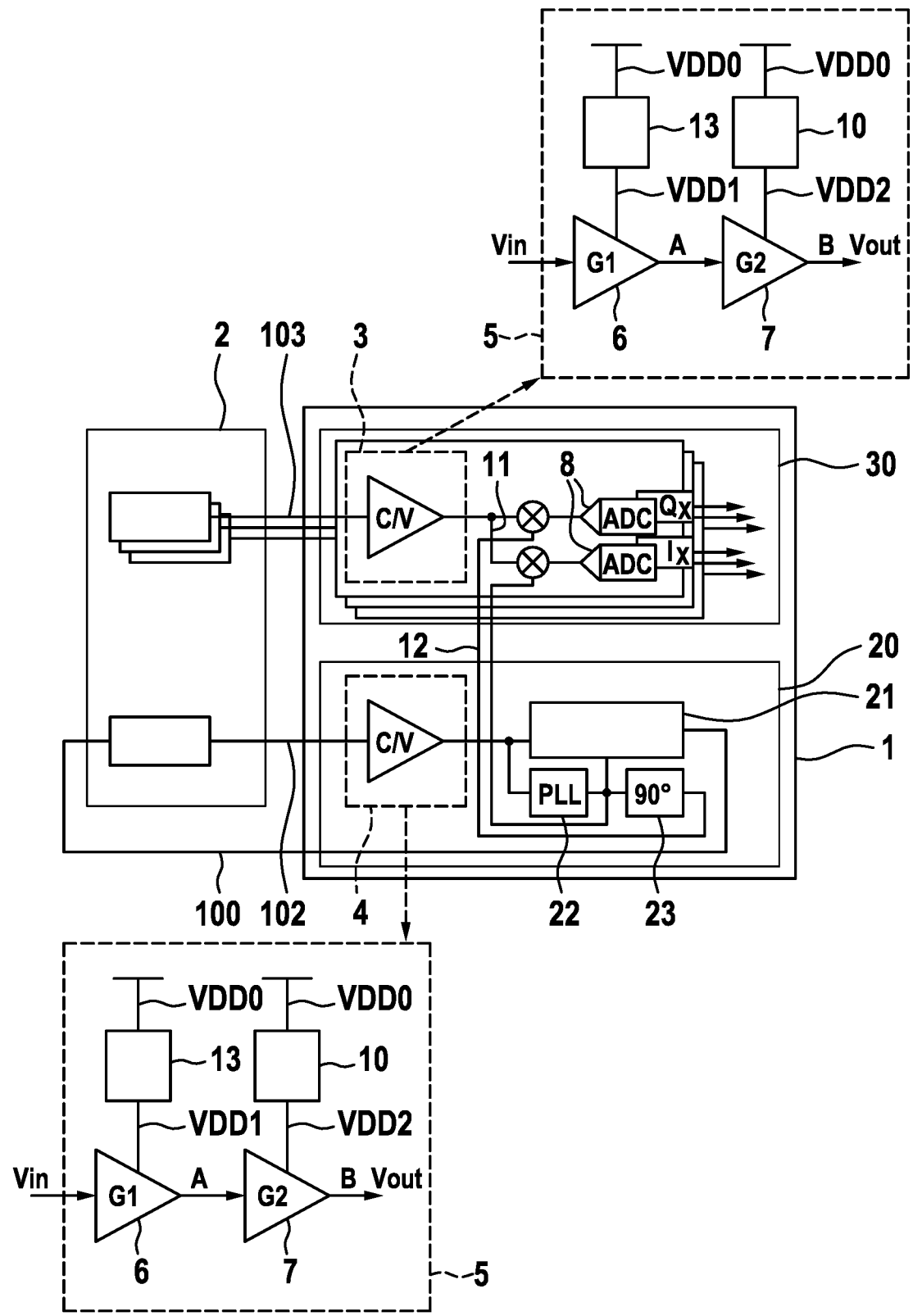

READOUT CIRCUIT FOR A MEMS SENSOR UNIT

FIELD

The present invention relates to a readout circuit for a MEMS sensor unit.

BACKGROUND INFORMATION

MEMS sensors are increasingly used in mobile electronic devices for private use. In particular for mobile applications, an energy consumption which is as low as possible of all installed components, and thus also of the MEMS sensors, is sought. One option for saving energy provides decreasing the supply voltage of the sensors, in particular, the supply voltage of the ASIC component of the sensor. However, this measure in general affects the performance of a typical sensor ASIC. In particular, individual circuit components in the analog signal path of the readout circuit are affected, such as, e.g., amplification factors of operation amplifiers, noise properties, MEMS drive, just to name a few.

SUMMARY

The measures according to the present invention make it possible to operate the readout circuit for a MEMS sensor unit with a relatively low external supply voltage, without having to tolerate performance losses, for example in the form of a decreased dynamic scope of individual circuit components in the analog signal path.

According to an example embodiment of the present invention, the readout circuit for a MEMS sensor unit includes at least one circuit component, which includes a cascade circuit including at least one input amplifier and at least one output amplifier. This readout circuit is operated with a predefined external supply voltage. According to the present invention, a first supply voltage is present at the input amplifier, which is less than or equal to the external supply voltage. The first supply voltage preferably corresponds to the external supply voltage or is generated by step-down conversion of the external supply voltage. In contrast, a second supply voltage, which is greater than the external supply voltage, is present at the output amplifier. For this purpose, at least one circuit means (i.e., circuit arrangement) is provided which makes the second supply voltage, which is greater than the external supply voltage, available to the output amplifier.

According to the present invention, it was recognized that the required dynamic range of the circuit component may also be achieved when the input amplifier is operated with a supply voltage which is less than or equal to the external supply voltage. The reason is that the dynamic scope of the cascade circuit may be increased easily and advantageously by operating the output amplifier with a supply voltage which is greater than the external supply voltage. Since, in the process, the supply voltage of only the output amplifiers of performance-critical circuit components in the analog signal path of the readout circuit is selectively increased, an overall performance may be enhanced, and an energy consumption of the readout circuit may be optimized.

Preferred refinements and embodiments of the present invention are disclosed herein.

It shall be noted at this point that the cascade circuit of the circuit component may also include a multitude of input amplifiers and output amplifiers.

The at least one circuit means which makes the second supply voltage, which is, by comparison, greater than the external supply voltage, available to the output amplifier is preferably a step-up converter. It may be, for example, a voltage multiplier, such as, e.g., a voltage doubler including a charge pump. The readout circuit may thus advantageously be operated with a reduced external supply voltage, and nonetheless the required dynamic scope of the cascade circuit may be adhered to particularly easily and cost-effectively.

Advantageously, the external supply voltage for the readout circuit is converted in a step-up process. This has the advantage that the at least one circuit means only has to be connected between the external supply voltage and the output amplifier to increase the dynamic scope of the cascade circuit at a lower external supply voltage.

One example of a circuit component which includes a cascade circuit including an input amplifier and an output amplifier is a capacitance-to-voltage converter (C/V converter). These converters are frequently used in the analog signal path of the readout circuit of capacitive MEMS sensor units. An analog-to-digital converter, whose different stages may encompass cascade circuits, shall be mentioned as another example here. However, it shall be expressly pointed out here that the measures according to the present invention may also be applied to other circuit components which include a cascade circuit including an input amplifier and an output amplifier.

Furthermore, it shall be noted that the measures according to the present invention may be applied to readout circuits for a wide variety of sensors. MEMS acceleration sensors and MEMS pressure sensors as well as MEMS gyroscopes shall be explicitly mentioned here.

BRIEF DESCRIPTION OF THE DRAWING

One exemplary embodiment of the present invention is described hereafter in greater detail with reference to the FIGURE.

FIG. 1 shows a schematic block circuit diagram of a readout circuit according to an example embodiment of the present invention for a MEMS gyroscope.

DETAILED DESCRIPTION OF EXAMPLE EMBODIMENTS

The MEMS gyroscope shown in FIG. 1 includes a seismic mass 2 which may be excited to carry out an oscillating movement, a drive circuit 20 for monitoring the oscillating movement of the seismic mass and for generating a driver signal 100 for exciting and maintaining a defined oscillating movement of seismic mass 2, and a sensing front end 30 for providing measuring signals of the MEMS gyroscope. Drive circuit 20 and sensing front end 30 are integral components of readout circuit 1.

For monitoring the oscillating movement of seismic mass 2, analog position signals 102 are supplied to drive circuit 20, here in the form of capacitance changes which reflect the oscillating movement of seismic mass 2. With the aid of a circuit component, C/V converter 4, position signals 102 are converted into voltage signals, based on which drive circuit 20 generates a driver signal 100 for seismic mass 2. For this purpose, drive circuit 20 in the exemplary embodiment shown here includes an amplitude controller component 21, a phase-locked loop 22, and a phase shifter component 23. Drive circuit 20 moreover generates clock signals 11 and 12, which are supplied to sensing front end 30.

In the case of a rotary movement of the sensor system about an axis perpendicular to the excitation direction of the oscillating movement of seismic mass 2, a Coriolis force acts on seismic mass 2 and effectuates a deflection perpendicular to the excitation direction and perpendicular to the rotation axis. This deflection is also detected here in the form of capacitance changes as an analog measuring signal 103 and is supplied to sensing front end 30, where it is converted into a voltage signal with the aid of a circuit component, C/V converter 3. This voltage signal is then demodulated with the aid of clock signals 11 and 12. The two analog signals thus generated are each supplied to an A/D converter 8 to then be further processed as a digital useful signal I or digital quadrature signal Q in a digital circuit part, which is not shown here.

C/V converter 4 forms the first stage in the analog signal path of drive circuit 20, similarly to the manner in which C/V converter 3 forms the first stage in the analog signal path of sensing front end 30. Both circuit components 3 and 4 include a cascade circuit 5, which is illustrated by the respective detailed illustrations.

Both cascade circuits 5 include an input amplifier 6 having amplification factor G1 and output A, and an output amplifier 7 having amplification factor G2 and output B. Amplification factors G1 and G2 are directly dependent on the magnitude of the supply voltage with which the respective amplifier, input amplifier 6 or output amplifier 7, is operated. Overall amplification factor G of cascade circuit 5 at output B results as: G=G1×G2. The signal dynamic at output A is considerably smaller than at output B. For this reason, input amplifier 6 may generally be operated with a comparatively low supply voltage VDD1. In contrast thereto, the signal dynamic at output B is considerably higher, which necessitates a considerably higher amplification factor G2 of the output amplifier 7 to avoid that output signal $V_{out}$ of cascade circuit 5 is completely saturated by input signal $V_{in}$. For this purpose, output amplifier 7 is operated with an increased supply voltage VDD2.

The present invention relates to the case that the predefined external supply voltage VDD0, with which the MEMS gyroscope described here is operated, is so low that the performance of individual circuit components of the readout circuit achieved thereby is not sufficient to meet the requirements with regard to the overall performance of the MEMS gyroscope. In the exemplary embodiment described here, the dynamic range of C/V converters 3 and 4 required for the operation of the MEMS gyroscope cannot be achieved with external supply voltage VDD0 alone.

Input amplifier 6 is operated with a first supply voltage VDD1 which is, by comparison, less than or equal to external supply voltage VDD0. For this purpose, cascade circuit 5 may include circuit means 13 which convert external supply voltage VDD0 in a step-down process. Moreover, cascade circuit 5 includes at least one circuit means 10, which provides a second supply voltage VDD2 to output amplifier 7 which is greater than supply voltage VDD1 of input amplifier 6 and than external supply voltage VDD0. A charge pump may be used for this purpose, for example, or also a step-up converter, which converts external supply voltage VDD0 in a step-up process for output amplifier 7, such as a voltage doubler or, generally speaking, a voltage multiplier. As a result, the desired dynamic range may thus be achieved.

Since output amplifier 7, and not input amplifier 6, of cascade circuit 5 is operated with a higher second supply voltage VDD2, it may additionally be ensured that output amplifier 7 is not saturated.

It shall be pointed out here that amplitude controller 21 of drive circuit 20 may also be a circuit component within the meaning of the present invention, which, namely, includes a cascade circuit including at least one input amplifier and at least one output amplifier. The output stage of such an amplitude regulator 21 namely requires an increased voltage to increase the energy transfer to seismic mass 2.

Finally, it shall be explicitly mentioned again that the present invention is not restricted to a readout circuit for a MEMS gyroscope and/or to the special embodiment of a C/V converter as a circuit component which encompasses a cascade circuit. The measures according to the present invention are rather also applicable to readout circuits of other MEMS sensor units. The use of the measures according to the present invention for circuit components in the input stage of the analog signal path is also of particular advantage, which is why the present invention was described here based on the example of a C/V converter.

What is claimed is:

1. A readout circuit for a MEMS sensor unit, comprising:
   at least one circuit component which includes a cascade circuit including at least one input amplifier and at least one output amplifier, a predefined external supply voltage (VDD0) being available for operating the readout circuit;
   wherein the input amplifier is operated with a first supply voltage which is, by comparison, less than or equal to the external supply voltage, the output amplifier is operated with a second supply voltage which is, by comparison, greater than the external supply voltage; and
   at least one circuit arrangement which makes the second supply voltage, which is, by comparison, greater than the external supply voltage, available to the output amplifier.

2. The readout circuit as recited in claim 1, wherein the circuit arrangement includes a step-up converter including a voltage multiplier.

3. The readout circuit as recited in claim 1, wherein the circuit arrangement converts the external supply voltage for the readout circuit in a step-up process.

4. The readout circuit as recited in claim 1, wherein a capacitance-to-voltage converter is the circuit component which includes the cascade circuit.

5. The readout circuit as recited in claim 1, wherein an analog-to-digital converter is the circuit component which includes the cascade circuit.

6. The readout circuit as recited in claim 1, wherein the MEMS sensor unit is a MEMS acceleration sensor or a MEMS pressure sensor.

7. The readout circuit as recited in claim 1, wherein the MEMS sensor unit is a MEMS gyroscope, at least including:
   a seismic mass which may be excited to carry out an oscillating movement;
   a drive circuit configured to monitor the oscillating movement of the seismic mass and to generate a driver signal for exciting and maintaining a defined oscillating movement of the seismic mass; and
   a sensing front end configured to provides measuring signals of the MEMS gyroscope,
   wherein an analog signal path of the drive circuit and/or an analog signal path of the sensing front end includes the at least one circuit component which includes the cascade circuit.

8. The readout circuit as recited in claim 7, wherein the drive circuit includes an amplitude controller component, and the amplitude controller component includes the cascade circuit including the input amplifier and the output amplifier.

\* \* \* \* \*